(12) United States Patent
Hendrix et al.

(10) Patent No.: US 9,172,417 B2
(45) Date of Patent: Oct. 27, 2015

(54) POWER MANAGEMENT FOR A BATTERY-POWERED HANDHELD AUDIO DEVICE

(71) Applicant: SigmaTel LLC, Austin, TX (US)

(72) Inventors: Jon David Hendrix, Wimberley, TX (US); Michael R. May, Austin, TX (US)

(73) Assignee: SIGMATEL, INC., Austin, TX (US)

(*) Notice: Subject to any disclaimer, the term of this patent is extended or adjusted under 35 U.S.C. 154(b) by 0 days.

(21) Appl. No.: 14/330,484

(22) Filed: Jul. 14, 2014

(65) Prior Publication Data

US 2014/0323074 A1   Oct. 30, 2014

Related U.S. Application Data

(62) Division of application No. 11/265,867, filed on Nov. 3, 2005, now Pat. No. 8,811,929.

(51) Int. Cl.

| | |
|---|---|
| H04B 1/06 | (2006.01) |
| H04B 1/16 | (2006.01) |
| H04W 52/02 | (2009.01) |
| H03G 3/20 | (2006.01) |
| H04B 1/10 | (2006.01) |

(52) U.S. Cl.
CPC .............. *H04B 1/1607* (2013.01); *H03G 3/20* (2013.01); *H04B 1/1018* (2013.01); *H04W 52/0245* (2013.01); *Y02B 60/50* (2013.01)

(58) Field of Classification Search
USPC ........................................ 455/234.1
See application file for complete search history.

(56) References Cited

U.S. PATENT DOCUMENTS

| | | | |
|---|---|---|---|
| 5,455,823 A | 10/1995 | Noreen et al. | |
| 5,945,949 A | 8/1999 | Yun | |
| 7,095,994 B1 | 8/2006 | Aytur et al. | |
| 7,106,816 B2 | 9/2006 | Filipovic | |
| 7,433,716 B2 | 10/2008 | Denton | |
| 2003/0125075 A1 | 7/2003 | Klovborg | |
| 2004/0092238 A1* | 5/2004 | Filipovic | 455/131 |
| 2004/0247993 A1* | 12/2004 | Johnson et al. | 429/50 |
| 2005/0060472 A1 | 3/2005 | Mantey et al. | |
| 2006/0264197 A1 | 11/2006 | Mahini et al. | |
| 2008/0194286 A1 | 8/2008 | Chen et al. | |

* cited by examiner

*Primary Examiner* — Ajibola Akinyemi

(57) ABSTRACT

A method for managing power of a battery powered handheld audio device by receiving an indicia of signal quality for a received continuous-time radio signal. The method compares the indicia of signal quality to a signal threshold. Upon a favorable comparison, enacting a first analog signal conditioning setting. Upon an unfavorable comparison, enacting a second analog signal conditioning setting. The method further provides, upon the favorable comparison, disabling a digital filtering operation, and upon the unfavorable comparison, enabling the digital filtering operation.

20 Claims, 11 Drawing Sheets battery-powered handheld
audio device 10 battery-powered handheld audio device 50 digital radio composite signal 52 signal quality indicia 60 battery-powered handheld audio device 90 battery-powered handheld audio device 90 digital filtering operation 108

POWER MANAGEMENT FOR A BATTERY-POWERED HANDHELD AUDIO DEVICE

BACKGROUND

1. Technical Field

This invention relates generally to portable handheld digital audio systems and more particularly to integrated circuits comprising a handheld audio system.

2. Description of Related Art

Handheld digital audio systems are becoming very popular. Such systems include digital audio players/recorders that record and subsequently playback MP3 files, WMA files, et cetera. Such digital audio players/recorders may also be used as digital dictaphones and file transfer devices. Further expansion of digital audio players/recorders includes providing a frequency modulation ("FM") radio receiver such that the device offers FM radio reception.

Such handheld digital audio systems use a battery (or batteries) to supply power to the circuitry of the device. The greater the circuit power consumption, the shorter the battery life (that is, the length of time a device can be operated before having to replace or charge the battery).

Therefore, a need exists for an integrated circuit that provides multiple functions for handheld devices with power management methodologies.

DETAILED DESCRIPTION OF THE DRAWINGS

Figure 1:
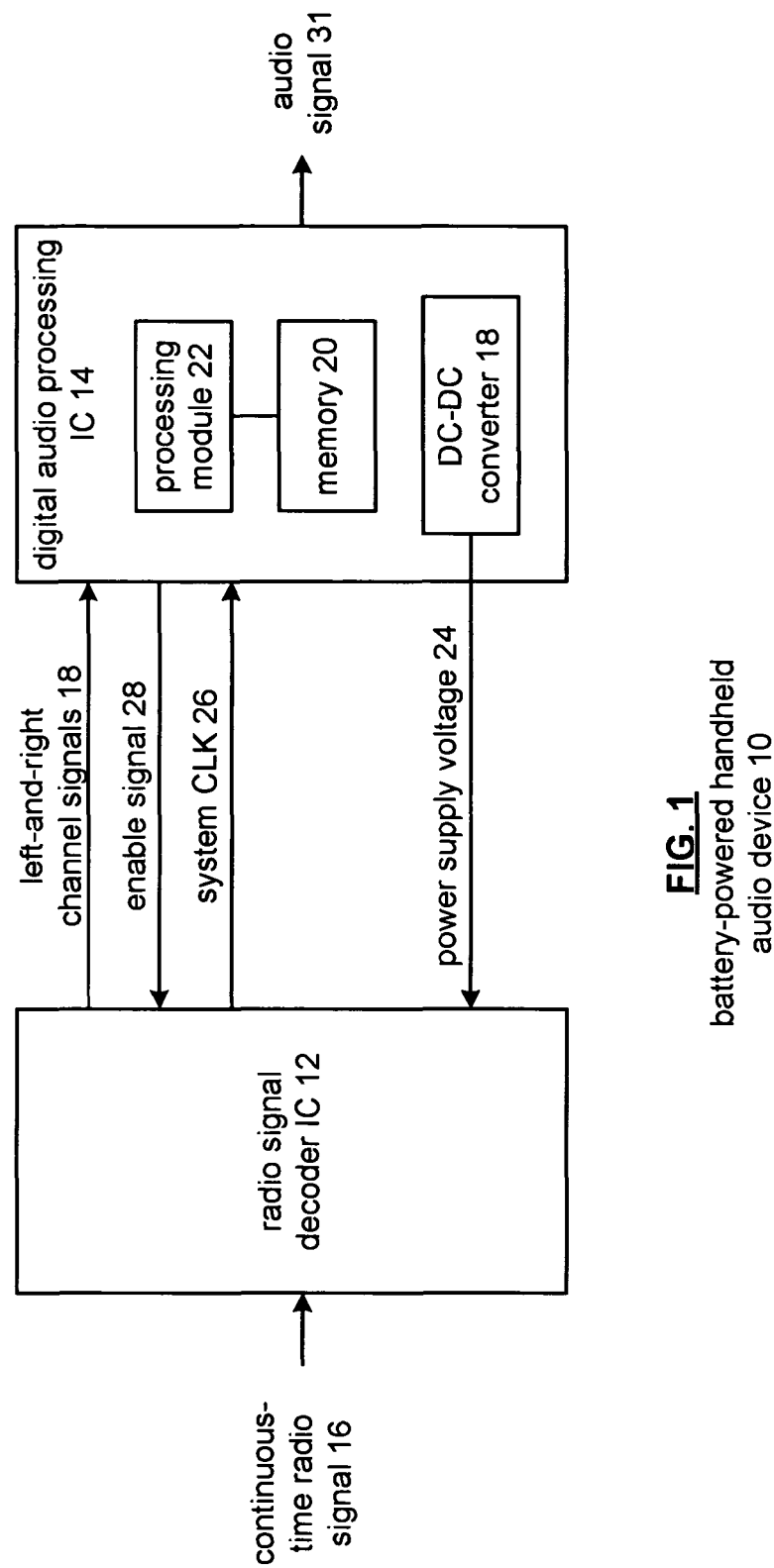
FIG. 1 is a schematic block diagram of a battery-powered handheld audio device in accordance with the present invention.

FIG. 1 is a schematic block diagram of a handheld audio system 10 that includes a radio signal decoder integrated circuit 12 and a digital audio processing integrated circuit 14. The digital audio processing integrated circuit 14 includes a processing module 22, memory 20, and a DC-to-DC converter 18. The processing module 22 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 20 may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 13 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory 20 stores, and the processing module 22 executes, operational instructions corresponding to at least some of the steps and/or functions illustrated in FIGS. 1 through 12.

In operation, when a battery, or other external power source, is initially applied to the radio signal decoder 12 and the digital audio processing IC 14, the DC-DC converter 18 generates a power supply voltage 24 based on an internal oscillation. When the power supply voltage 24 reaches a desired value (for example, near a regulated value), the radio signal decoder IC 12 generates the system clock 26; with the remaining functionality of the radio signal decoder 12 being inactive awaiting enable signal 28 or being activated once the system clock 26 is functioning. Note that enable signal 28 may be provided as part of a digital interface. The radio signal decoder 12 provides the system clock 26 to the audio processing integrated circuit 14. Upon receiving the system clock 26, the DC-DC converter switches from the internal oscillation to the system clock 26 to produce the power supply voltage 24 from a battery voltage, or external power source.

With the system clock 26 functioning, the radio signal decoder IC 12 converts a continuous-time radio signal 16 into left-and-right channel signals 18, which may be analog or digital signals. In one embodiment, the left-and-right channel signals 18 include a left-plus-right ("LPR") signal and a left-minus-right ("LMR") signal. The radio signal decoding IC 12 provides the left-and-right channel signals 18 to the digital audio processing IC 14.

The digital audio processing integrated circuit 14, which may be a digital audio player/recorder integrated circuit such as the STMP35XX and/or the STMP36XX digital audio processing system integrated circuits manufactured and distributed by Sigmatel Incorporated, receives the left-and-right channel signals 18 and produces therefrom audio signals 31. The digital audio processing IC 14 may provide the audio signals 31 to a headphone set or other type of speaker output. As an alternative to producing the audio signals 31 from the left-and-right channel signals 18, the digital audio processing integrated circuit 14 process stored MP3 files, stored WMA files, and/or other stored digital audio files to produce the audio signals 31.

Figure 2:
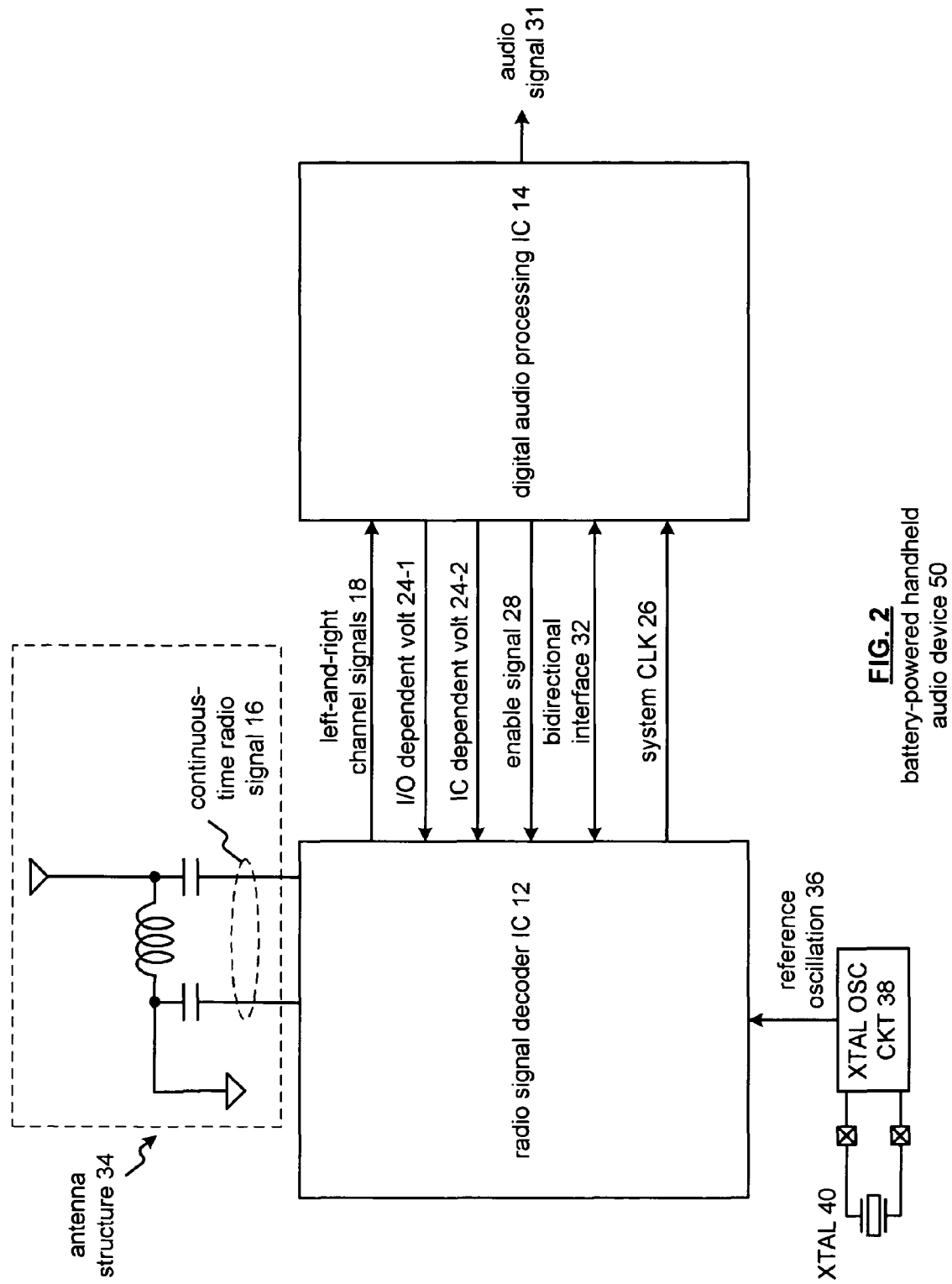
FIG. 2 is a schematic block diagram of another embodiment of a battery-powered handheld audio device in accordance with the present invention.

FIG. 2 is a schematic block diagram of another handheld audio system 50 that includes the radio signal decoder integrated circuit 12 and the digital audio processing integrated circuit 14. In this embodiment, the radio signal decoder integrated circuit 12 is operably coupled to a crystal oscillator circuit 38 and an antenna structure 34. The crystal oscillation circuit 38 is operably coupled to a crystal XTAL 40 and produces therefrom a reference oscillation 36. The radio signal decoder integrated circuit 12, which may include one or more phase locked loops, converts the reference oscillation 36 into an oscillation from which the system clock 26 is derived. For example, the system clock 26 may be the output oscillation of a phase locked loop, an oscillation that is a multiple or fraction of the output oscillation of the phase locked loop.

The antenna structure 34 includes an antenna, a plurality of capacitors, and an inductor coupled as shown. The continuous-time radio signal 16 is provided from the antenna structure 34 to the radio signal decoder integrated circuit 12. As with the embodiment of FIG. 1, the radio signal decoder integrated circuit 12 converts the received radio signal 16 into left-and-right channel signals 18.

The digital audio processing integrated circuit 14, via the DC-DC converter 18, generates an input/output (I/O) dependent supply voltage 24-1 and an integrated circuit (IC) dependent voltage 24-2 that are supplied to the radio signal decoder IC 12. In one embodiment, the I/O dependent voltage 24-1 is dependent on the supply voltage required for input/output interfacing of the radio signal decoder IC and/or the digital audio processing IC 14 (for example, 3.3 volts) and the IC dependent voltage 24-2 is dependent on the IC process technology used to produce integrated circuits 12 and 14. In an embodiment, the integrated circuit process technology is 0.08 to 0.35 micron CMOS technology where the IC dependent voltage 24-2 is 1.8 volts or less.

The interface between the integrated circuits 12 and 14 further includes a bi-directional interface 32. Such an interface may be a serial interface for the integrated circuits 12 and 14 to exchange control data and/or other type of data, including the enable signal 28. In one embodiment, the bi-directional interface 32 may be one or more serial communication paths that are in accordance with the I²C serial transmission protocol. As one of ordinary skill in the art will appreciate, other serial transmission protocols may be used for the bi-directional interface 32 and the bi-directional interface 32 may include one or more serial transmission paths.

Figure 3:
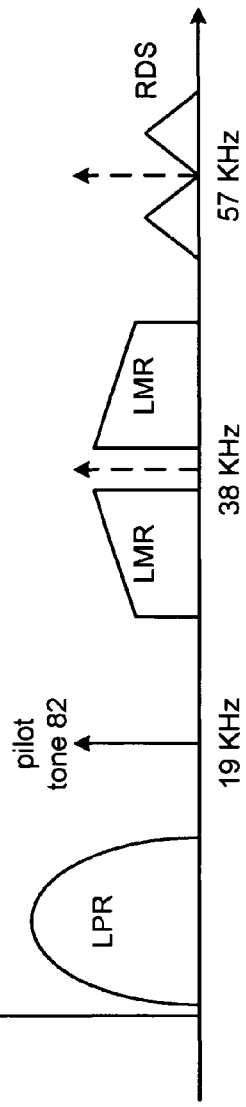
FIG. 3 is a frequency diagram of a digital radio composite signal format.

FIG. 3 is a frequency diagram of a digital radio composite signal format 52 used to carry stereophonic audio under a pilot-tone multiplex system. The radio signal decoder IC 12 processes and demodulates the continuous-time radio signal 16 to produce the digital radio composite signal format 52, which is then further processed by the radio signal decoder IC 12 and/or digital audio processing IC 14 to provide audio signals 31. The pilot-tone multiplex system multiplexes the left and right audio signal channels in a manner compatible with mono sound, using a sum-and-difference technique to produce a "mono-compatible" composite signal. The signal includes a pilot tone 82 at 19 kHz and another tone at 38 kHz. The signal 52 also includes digital left-channel and digital right-channel data in the form of a low frequency "sum" or left-plus-right ("LPR") signal component, and a higher frequency "difference" or left-minus-right ("LMR") signal component. Also shown is a radio data system ("RDS") signal component. The LMR signal component is modulated on the 38 kHz suppressed subcarrier to produce a double sideband suppressed carrier signal ("DSBCS"). The RDS signal component contains digital information including time and radio station identification, and uses a sub-carrier tone at 57 kHz.

Figure 4:
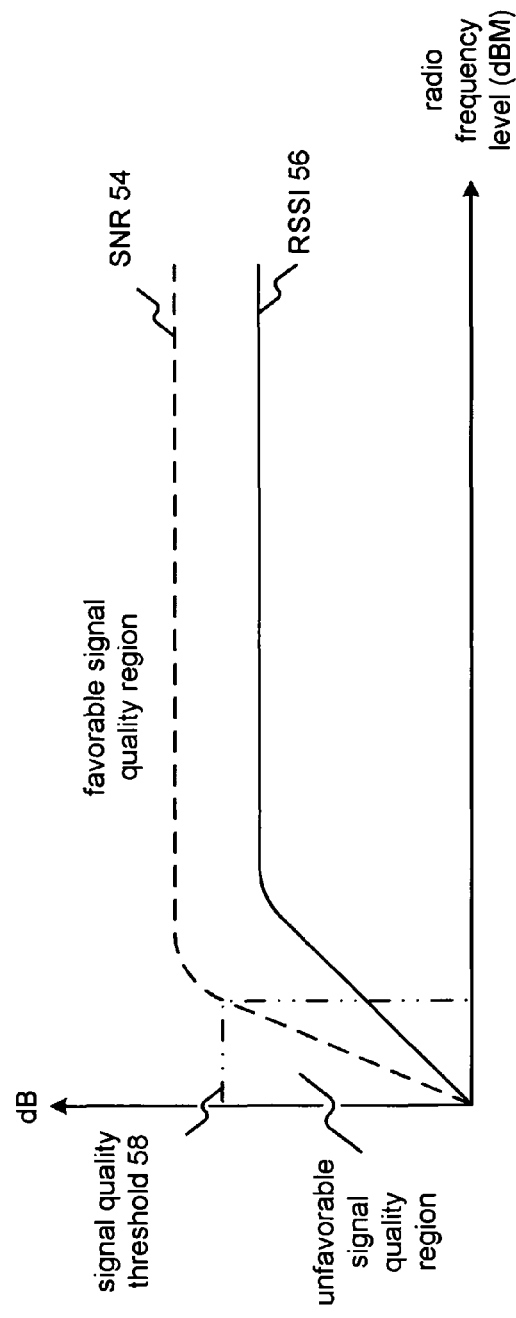
FIG. 4 is a diagram of indicia of signal quality for a continuous-time radio signal of FIG. 3.

FIG. 4 is a diagram of signal quality indicia for a continuous-time radio signal. The signal quality indicia includes a signal-to-noise ratio ("SNR") 54 and a received signal strength indicator ("RSSI") 56. Generally, the signal quality indicia indicates the quality of a continuous-time radio signal 16 (for example, an FM signal) to provide audio signals 31 suitable for listener playback. The SNR 54 is the ratio of the usable signal being received compared to the noise or undesired signal. The RSSI 56 indicates the strength of the continuous-time radio signal 16. When the SNR 54 and/or the RSSI 56 of a continuous-time radio signal 16 are within the boundary of the signal quality threshold 58 (or unfavorable signal quality region), the continuous-time radio signal 16 is at a reduced quality level that is perceivable by an average user, and the digital radio composite signal 52 requires additional processing and power resources to provide a suitable audio playback via the audio signals 31. For example, under low quality signal conditions, the radio signal decoder IC 12 compensates by increasing the analog signal processing gains (such as increasing the gain of a low noise amplifier) and/or for the digital audio processing IC 14 to use weak signal processing to extract the desired audio signal, such as those in a digital radio composite signal format 52, from the associated noise. Other examples of signal quality indicia are multi-path echo, adjacent channel interference, et cetera.

Figure 5:
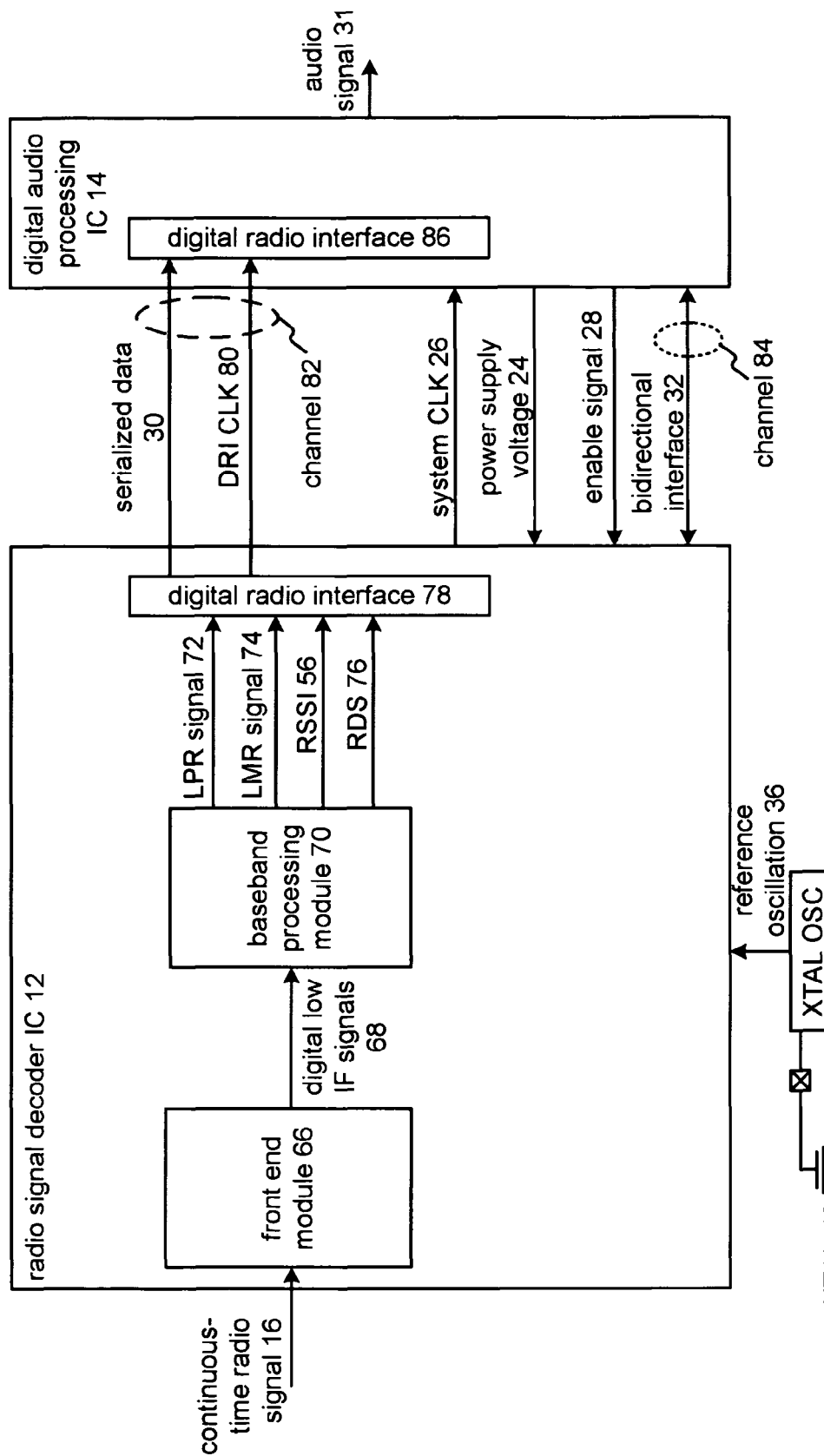
FIG. 5 is a schematic block diagram of yet another embodiment of a battery-powered handheld audio device in accordance with the present invention.

FIG. 5 is a schematic block diagram of yet another embodiment of a handheld audio system 90 that includes the radio signal decoder IC 12 and the digital audio processing IC 14. In this embodiment, the radio signal decoder IC 12 includes a front-end module 66, a baseband processing module 70, and a digital radio interface 78. The digital audio processing IC 14 includes a digital radio interface 86. The digital radio interface 78 and the digital radio interface 86 are coupled via a channel 82. The channel 82 may be a synchronous or asynchronous channel. Also, the radio signal decoder IC 12 and the digital audio processing IC 14 are coupled via a channel 84 that includes the bidirectional interface 32. The front-end module 66 contains circuitry to process and convert the received radio signal 16 to digital data, shown as digital low intermediate frequency ("IF") signals 68. The baseband processing module 70 is operably coupled to convert the digital low IF signals 68 into digital baseband signals and to produce therefrom the LPR signal 72 and LMR signal 74 that contain the audio data provided by the continuous-time radio signal 16. For a more detailed discussion of the front-end circuitry and/or the baseband processing U.S. patent application entitled HANDHELD AUDIO SYSTEM, having a filing date of May 11, 2005, and a serial number of Ser. No. 11/126,554, which is hereby incorporated herein by reference.

The digital radio interface 78 is operably coupled to the digital radio interface 86 to provide the LPR signal 72, the LMR signal 74, and the RDS data 76 to the digital audio processing integrated circuit 14. For a more detailed discussion of the digital radio interface 78 refer to U.S. patent application entitled CHANNEL INTERFACE FOR CONVEYING DIGITAL DATA HAVING A LOWER DATA RATE, having a filing date of Sep. 9, 2005, and a serial number of Ser. No. 11/222,535, which is hereby incorporated herein by reference.

Within the radio signal decoder IC 12, the digital radio interface 78 converts the parallel LPR signal 72, LMR signal 74, and RDS data 76 into a serialized data signal 30. The digital radio interface 86 converts the serialized data 30 back into parallel signals for further audio signal processing by the digital audio processing IC 14. Note that the serial-to-parallel and parallel-to-serial functionality of the digital radio interfaces 78 and 86 may be programmable based on the sample rate of the radio signal decoder IC 12, a desired data rate, or other parameters of the ICs 12 and 14 (for example, 44.1 KHz, 48 KHz, multiples thereof, and/or fractions thereof).

The digital radio interface 78 may convey more than left- and-right channel signals, shown as LPR signal 72 and the LMR signal 74. For instance, the digital radio interface 52 may convey RSSI 56, data clock rates, control information, functionality enable/disable signals, functionality regulation and/or control signals, and RDS 76 between the ICs 12 and 14.

Figure 6:
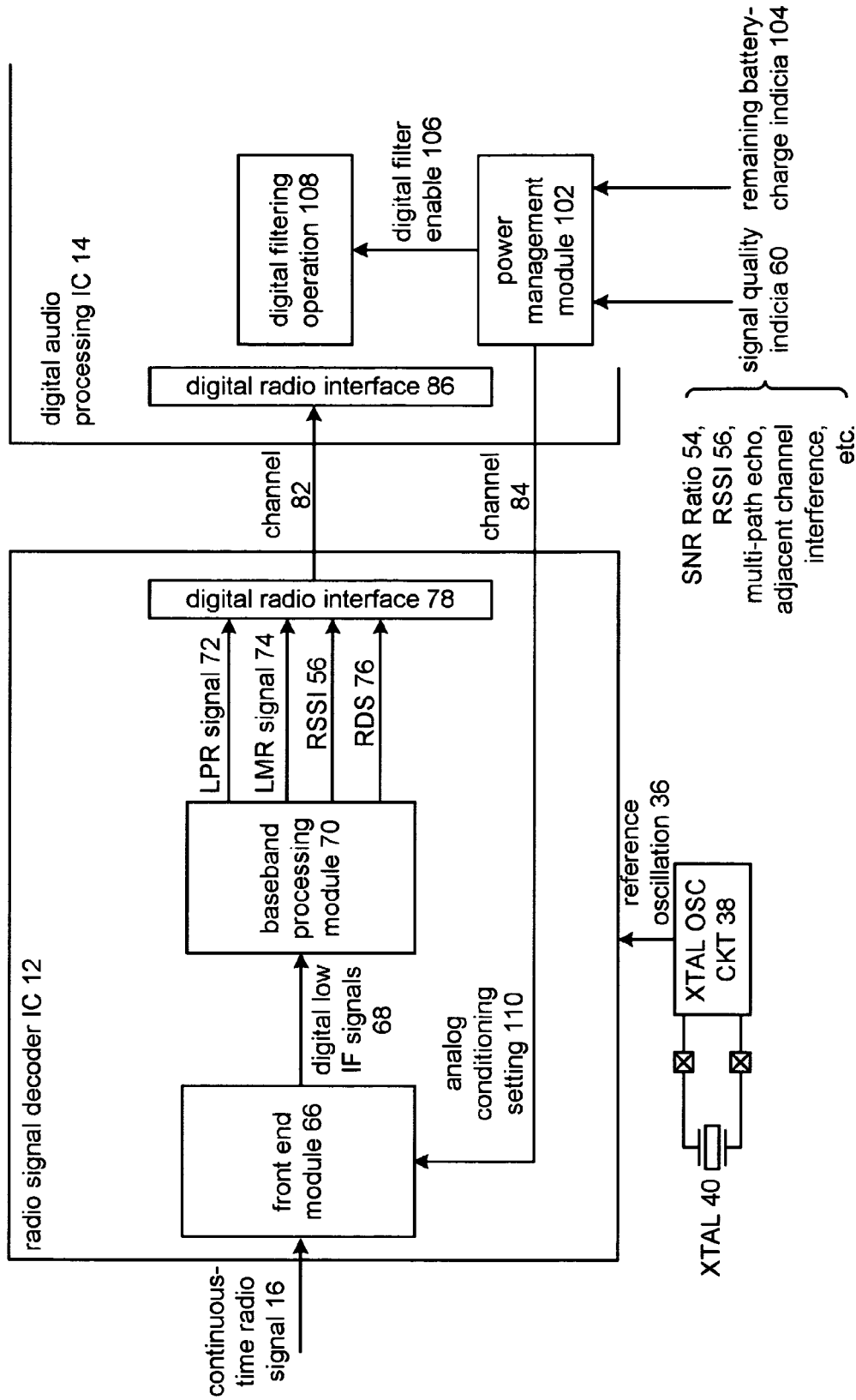
FIG. 6 is a schematic block diagram of yet another embodiment of a battery-powered handheld audio device in accordance with the present invention.

FIG. 6 is a schematic block diagram of yet another embodiment of a battery-powered handheld audio device 90 that includes the radio signal decoder IC 12 and the digital audio processing IC 14. The radio signal decoder IC 12 includes a front end module 66, a baseband processing module 70, and a digital radio interface 78. The digital audio processing IC 14 includes a power management module 102, a digital filtering operation 108, and a digital radio interface 86. The digital radio interface 78 and the digital radio interface 86 are coupled via a channel 82.

The power management module 102 receives a signal quality indicia 60 and a remaining battery-charge indicia 104. The signal quality indicia 60 may be provided by an SNR 54, an RSSI 56, a multi-path echo, adjacent channel interference, et cetera. Based upon the signal quality indicia 60 and/or remaining battery-charge indicia 104, the power management module 102 provides a digital filter enable 106 and an analog conditioning setting 110. The digital filtering enable 106 enables and/or disables at least a portion of the digital filtering operation 108. The power management module 102 adjusts the power consumption to the analog components (for example, via amplifier gain magnitude limits, reduced filter responses, et cetera) of the radio signal decoder IC 12 through digital control channel 84, such as the front end module 66, via the analog conditioning setting 110. The details of the digital filter enable 106 and the analog conditioning setting 110 will be discussed with reference to FIGS. 7 through 10.

In operation, the power management module 102 manages the battery life of a battery power source for the battery-powered handheld audio device 90, in view of the signal quality of the continuous-time radio signal 16 and/or the battery charge level for the device. When the quality of the continuous-time radio signal 16 (for example, the indicia exceed the signal quality threshold 58 (see FIG. 4)), extensive front-end processing of the continuous-time radio signal 16 is not necessary, allowing the power management module 102, via the analog conditioning setting 110, to reduce the gain and/or power of the analog portion of the radio signal decoder IC 12. Also, the power management module 102 can reduce power consumption by the digital audio processing IC 14 by disabling the digital filtering operation 108 via the digital filter enable 106.

When the remaining battery-charge indicia 104 indicates that the battery charge level is low, the desire is to extend the useful playback life of the battery-powered handheld audio device 90. Under these circumstances, the audio signal quality may be less than optimal because of static, distortion, and/or due to other forms of radio signal interference, but the content (or radio programming) of the continuous-time radio signal 16 can be provided due to the extended battery charge for the device.

Figure 7:
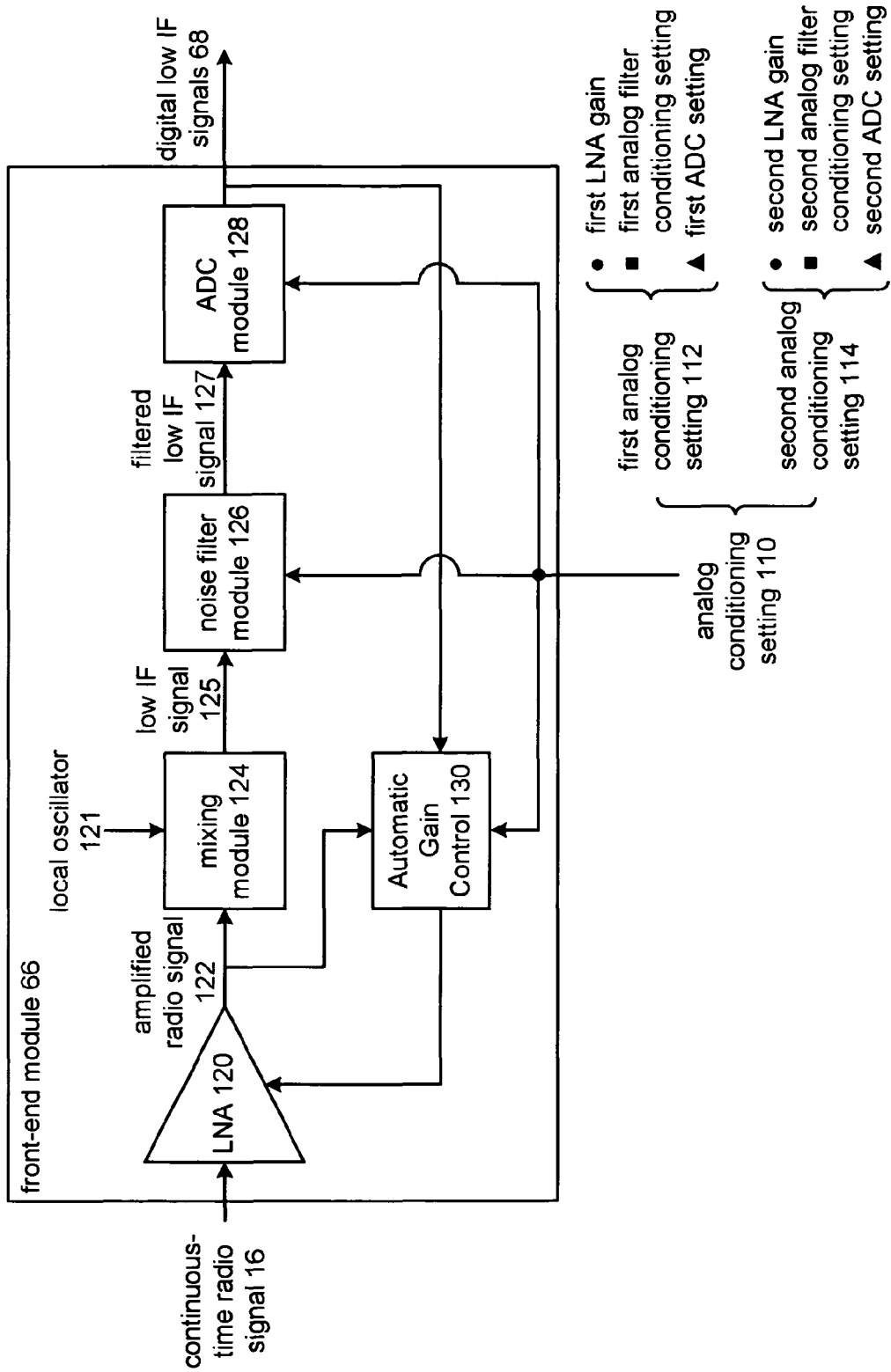
FIG. 7 is a schematic block diagram of a front-end module for a battery-powered handheld audio device in accordance with the present invention.

FIG. 7 is a schematic block diagram of a front-end module 66 that includes a low noise amplifier ("LNA") 120, a mixing module 124, a noise filter module 126, an analog-to digital converter ("ADC") module 128, and an automatic gain control 130. The LNA 120 amplifies the continuous-time radio signal 16 to provide an amplified radio signal 122. The LNA 120 reduces the overall noise figure of the front-end module 66 in that the input-referred noise of the subsequent stages can be reduced by the adjusting the gain of the low noise amplifier 120. For example, the LNA 120 boosts the desired signal power to weak signals while adding as little noise or distortion as possible. The gain of the LNA 120 is adjustable via the automatic gain control ("AGC") 130 feedback.

The mixing module 124 receives and down-converts the amplified radio signal 122, with respect to a local oscillator 121, providing a low IF signal 125. The noise filter module 126 receives the low IF signal 125 and removes unwanted signal portions, or noise, introduced by the mixing module 124 to provide a filtered low IF signal 127. The ADC module 128 receives and converts the filtered low IF signal 127 into a digital low IF signal 68. In one embodiment, the digital low IF signal 68 is a complex signal including an in-phase ("I") component and a quadrature ("Q") component. Accordingly, the ADC module 128 converts the I and Q components of the filtered low IF signal 127 into a corresponding I and Q digital signal 68.

The AGC 130 provides the gain setting for the LNA 120 by monitoring the signal strength from the ADC module 128 and the LNA 120. The AGC 130, in providing the gain setting, relies on the signal strength from the ADC module 128 output. The AGC 130 also considers the signal strength of the LNA 120 output to limit requests of excessive gain from the LNA 120.

The power management module 102 generates the analog conditioning setting 110 based upon signal quality indicia 60 and/or the remaining battery charge indicia 104. The analog conditioning setting 110 is provided to the noise filter module 126, AGC 130 and/or ADC module 128 to adjust the power consumption levels of the front-end module 66 and the analog components therein via the first and the second analog conditioning setting 112 and 114. Note that the front-end module 66 may contain further modules that are disposed towards power management by the power management module 102, via the analog conditioning setting 110.

When the signal quality indicia 60 indicates a favorable signal quality, the first analog conditioning setting 112 provides a first LNA gain to the AGC 130, a first analog filter conditioning setting to the noise filter module 126 and/or a first ADC setting to the ADC module 128. With favorable signal quality, extensive analog processing of the continuous-time radio signal 16 is not required, and a savings on battery source consumption can be recognized by limiting the processing parameters of the front-end module 66. Examples of processing parameters are the gain magnitude for amplifiers, the bias and/or operational conditions, et cetera. When the signal quality indicia 60 indicates an unfavorable signal quality, the analog conditioning setting 110 provides a second analog conditioning setting 114 having a second analog gain, a second analog filter conditioning setting, and/or a second ADC setting to the ADC module 128. The second analog conditioning setting 114 provides for additional analog processing and/or amplification of the continuous-time radio signal 16. That is, under the first analog conditioning setting 112, the front-end module 66 consumes less power than under the second analog conditioning setting 114.

Also, when there are a plurality of settings associated with the first conditioning setting 112 and/or the second conditioning setting 114, the power management module 102 can apply the associated settings of the first conditioning setting 112 and/or the second conditioning setting 114 in a predetermined sequence that is based upon the information provided by the signal quality indicia 60 and/or the remaining battery-charge indicia 104. For example, the sequence may be ordered from a lowest-power-consumption setting to a greatest-power-consumption setting to generally coincide with battery charge consumption by the device. As a further example, as signal quality may deteriorate, the power management module 102 provides a graduated sequence of the plurality of settings so as to minimize abrupt changes in quality of the audio signal 31.

Figure 8:
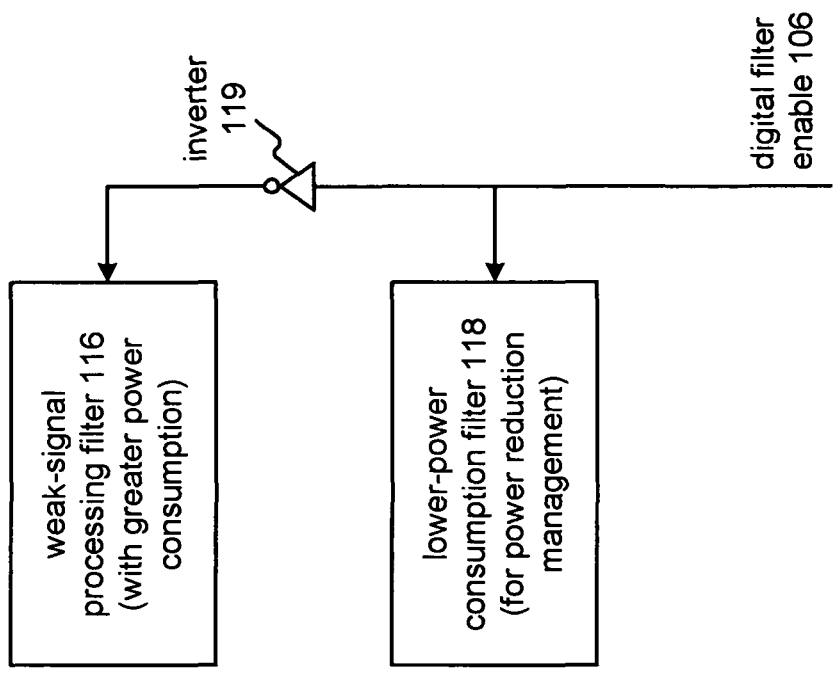
FIG. 8 is a schematic block diagram of a digital filtering operation for a battery-powered handheld audio device in accordance with the present invention.

FIG. 8 is a schematic block diagram of a digital filtering operation 108 that includes a weak-signal processing filter 116 and a lower-power consumption filter 118. The weak-signal processing filter 116 and the lower-power consumption filter 118 are configured as being alternately enabled or disabled via the logic inverter 119. The weak-signal processing filter 116 functions to minimize poor signal quality effects (such as reflected by an unfavorable RSSI, SNR, multi-path echo, adjacent channel interference, et cetera) on the audio processing to the LPR signal 72 and LMR signal 74. Accordingly, the weak signal processing filter 116 is more processor and power intensive than the lower-power consumption filter 118, which provides reduced audio processing to the LPR signal 72 and the LMR signal 74. When the remaining battery-charge indicia 104 reflects an unfavorable remaining battery charge with respect to a battery charge threshold, the power management module 102 disables the weak-signal processing filter 116. In this mode, the remaining charge of the power source is conserved at the sacrifice of audio processing quality under unfavorable signal quality conditions. The lower-power consumption filter 118 provides less processing and power intensive signal processing of the digital LPR signal 72 and LMR signal 74. As one of ordinary skill in the art may appreciate, the power management module 102 can provide gradual switching through a portion of the weak-signal processing filter 116 and a portion of the lower-power consumption filter 118, resulting in a graduated trade-off between filter and power performance of the digital filtering operation 108. Doing so serves to mitigate abrupt changes in audio quality of the audio output to a user.

Figure 9:
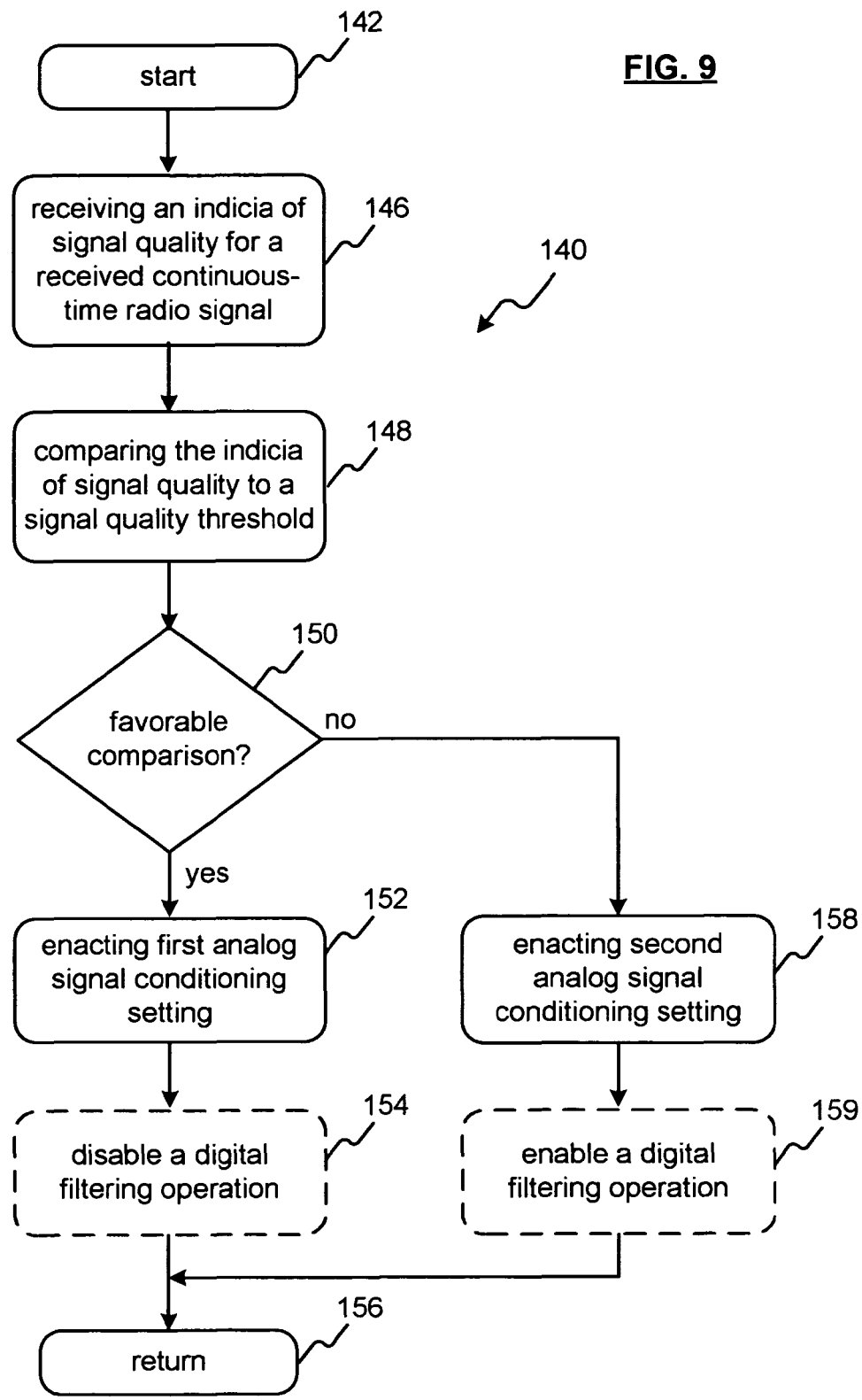
FIG. 9 is a flow diagram illustrating a power management method in accordance with the present invention.

FIG. 9 is a flow diagram illustrating a method 140 for managing power of the battery-powered handheld device that begins at step 142. At step 146, the method receives an indicia of signal quality for a received continuous-time radio signal. The method compares the indicia of signal quality to a signal quality threshold (step 148). When a favorable comparison results at step 150, enacting a first analog signal conditioning setting takes place at step 152. Additional power management may further be provided by disabling a digital filtering operation at step 154, as indicated by the dashed lines. The method returns at step 156. When an unfavorable comparison results at step 150, enacting a second analog signal conditioning setting takes place at step 158, and may further enable a digital filtering operation at step 159, as indicated by the dashed lines, and then returns at step 156.

Figure 10:
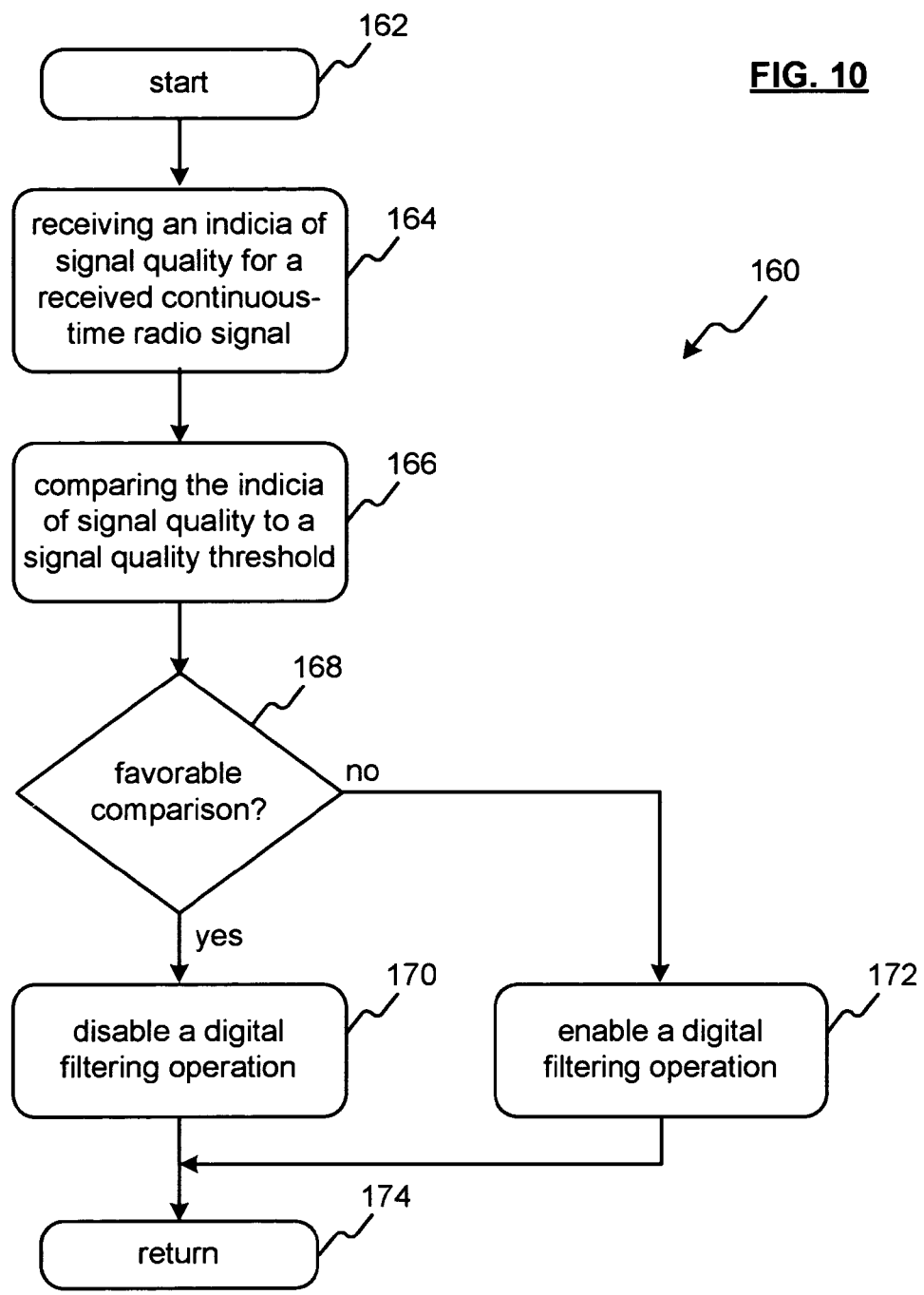
FIG. 10 is a flow diagram illustrating another power management method in accordance with the present invention.

FIG. 10 is a flow diagram illustrating another method 160 for managing power of the battery-powered handheld device that begins at step 162. At step 164 the method receives an indicia of signal quality for a received continuous-time radio signal. The indicia signal quality, at step 166, is compared to a signal quality threshold. Upon a favorable comparison result at step 168, the method disables a digital filtering operation at step 170 and returns at step 174. When an unfavorable comparison results at step 168 the method enables a digital filtering operation 172 and returns at step 174.

Figure 11:
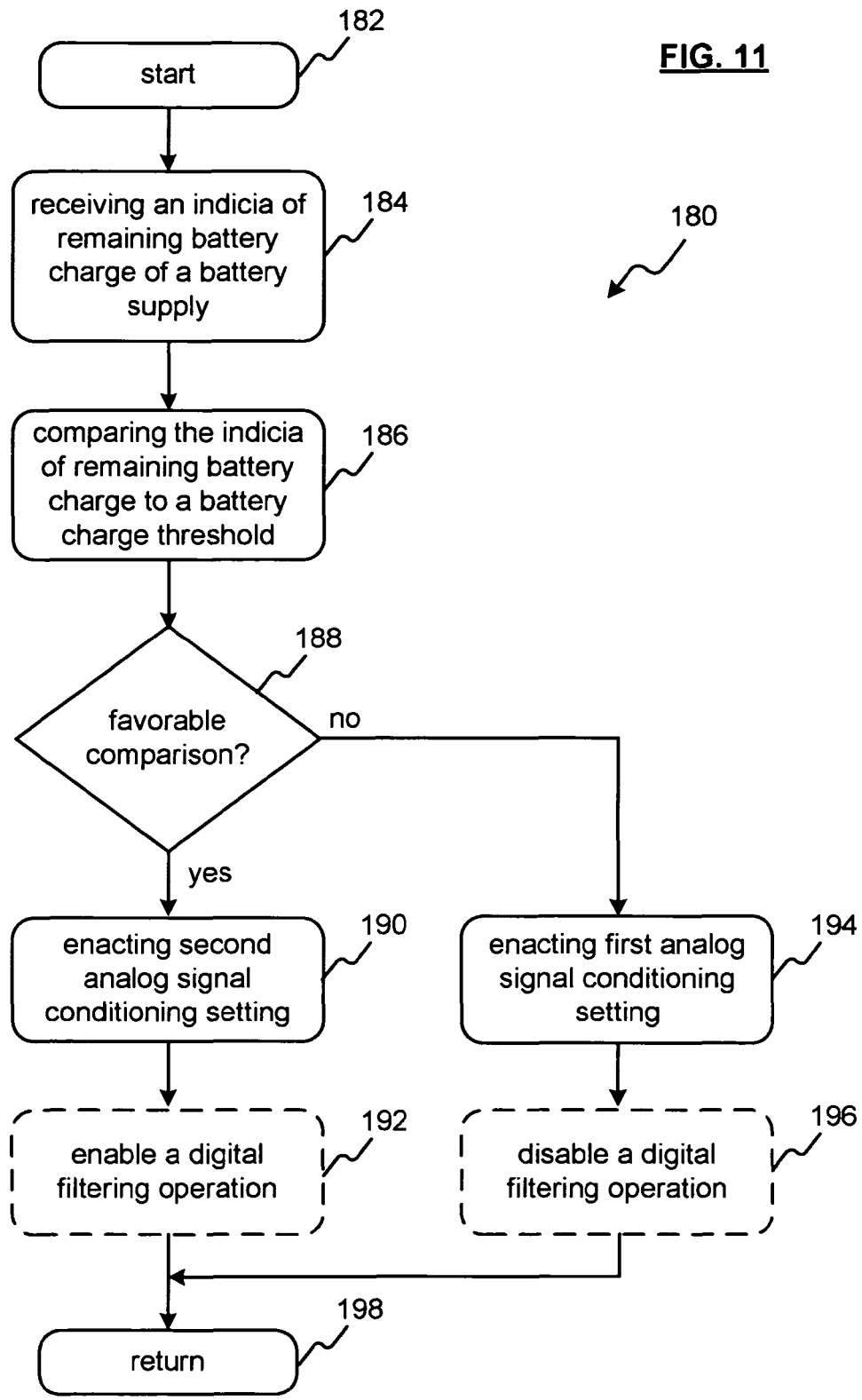
FIG. 11 is a flow diagram illustrating yet another power management method in accordance with the present invention.

FIG. 11 is a flow diagram illustrating yet another method 180 for managing power of the battery-powered handheld device that begins at step 182. At step 184, the method receives an indicia of remaining battery charge of a battery supply. The indicia of remaining battery charge, at step 186, is compared to a battery charge threshold. Upon a favorable comparison result at step 188, the method enacts a second analog signal conditioning setting 190, and may further enable a digital filtering operation at step 192, as indicated by the dashed lines. The method 180 returns at step 198. Upon an unfavorable comparison at step 188, the method enacts a first analog signal conditioning setting at step 194 and may further disable a digital filtering operation at step 196, as indicated by the dashed lines, after which the method returns at step 198.

Figure 12:
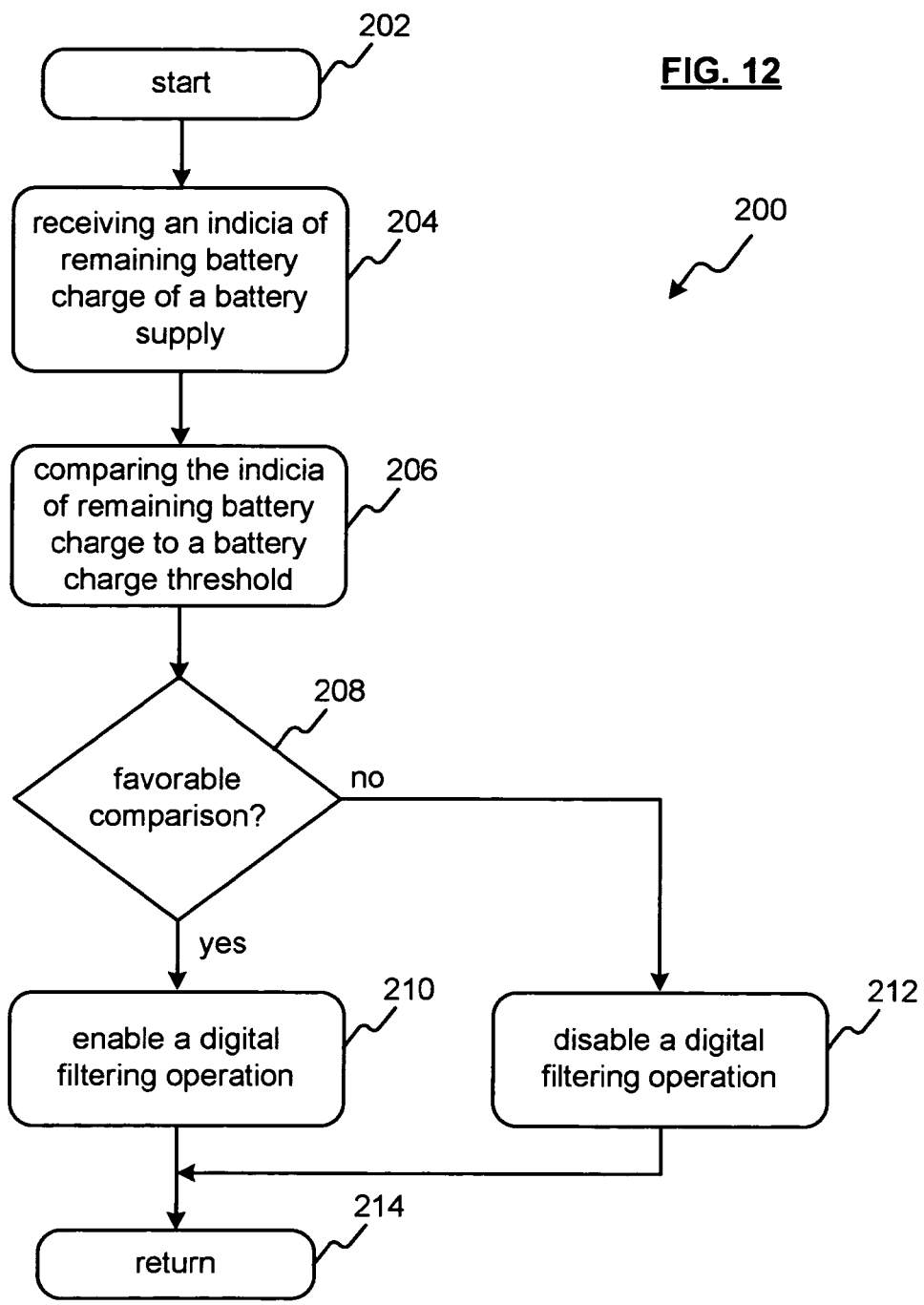
FIG. 12 is a flow diagram illustrating a further power management method in accordance with the present invention.

FIG. 12 is a flow diagram illustrating yet another method 200 for managing power of the battery-powered handheld device that begins at step 202. At step 204, the method receives an indicia of remaining battery charge of a battery supply. The method compares the indicia of remaining battery charge to a battery charge threshold at step 206. Upon a favorable comparison at step 208, the method enables a digital filtering operation at step 210 and returns at step 214. Upon an unfavorable comparison result at step 208, the method disables a digital filtering operation 212 and returns at step 214.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (that is, where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, et cetera, provides a desired relationship. For example, when the desired relationship is that a first signal has a greater magnitude than a second signal, a favorable comparison may be achieved when the magnitude of the first signal is greater than that of the second signal or when the magnitude of the second signal is less than that of the first signal.

The preceding discussion has presented a battery-powered handheld audio device that incorporates a radio signal decoder integrated circuit having a digital radio interface with the capability to manage power of the device based on signal quality and/or remaining battery-charge indicia. As one of average skill in the art will appreciate, other embodiments may be derived from the teaching of the present invention without deviating from the scope of the claims.

What is claimed is:

1. A method for managing power of a battery-powered handheld audio device, comprises:
   receiving an indicia of remaining battery charge of a battery supply;
   comparing the indicia of remaining battery charge to a battery charge threshold;
   upon an unfavorable comparison, enacting a first analog signal conditioning setting that includes analog filtering; and
   upon a favorable comparison, enacting a second analog signal conditioning setting that includes a differing analog filtering, wherein the first analog signal conditioning setting causes less power to be consumed during operation than the second analog signal conditioning setting.

2. The method of claim 1, wherein:
the first analog signal conditioning setting includes a first low noise amplifier (LNA) gain; and
the second analog signal conditioning setting includes a second LNA gain that is greater than the first LNA gain and has higher battery consumption.

3. The method of claim 1 further comprises:
upon the favorable comparison, conditionally enabling a digital filtering operation; and
upon the unfavorable comparison, disabling the digital filtering operation.

4. The method of claim 3 wherein the digital filtering operation comprises:
weak-signal processing of a received continuous-time radio signal.

5. The method of claim 3 wherein the enabling a digital filtering operation is conditioned on
a signal quality status with the enabling allowed only when signal quality is poor.

6. A method for managing power of a battery-powered handheld audio device, comprises:
receiving an indicia of remaining battery charge of a battery supply;
comparing the indicia of remaining battery charge to a battery charge threshold;
upon an unfavorable comparison, enacting a first analog signal conditioning setting that includes analog filtering; and
upon a favorable comparison, enacting a second analog signal conditioning setting that includes a differing analog filtering,
wherein the first analog signal conditioning setting includes a first analog filter setting; and
wherein the second analog signal conditioning setting includes a second analog filter setting,
wherein the first analog filter setting causes a corresponding analog filter to consume less power than the second analog filter setting.

7. A method for managing power of a battery-powered handheld audio device, comprises:
receiving an indicia of remaining battery charge of a battery supply;
comparing the indicia of remaining battery charge to a battery charge threshold;
upon an unfavorable comparison, enacting a first analog signal conditioning setting that includes analog filtering; and
upon a favorable comparison, enacting a second analog signal conditioning setting that includes a differing analog filtering,
wherein the first analog signal conditioning setting includes a first ADC setting; and
wherein the second analog signal conditioning setting includes a second ADC setting that is greater than the first ADC setting,
wherein the first ADC setting causes a corresponding ADC to consume less power than the second analog filter setting.

8. A method for managing power of a battery-powered handheld audio device, comprises:
receiving an indicia of remaining battery charge of a battery supply;
comparing the indicia of remaining battery charge to a battery charge threshold;
upon an unfavorable comparison, enacting a first analog signal conditioning setting that includes analog filtering; and
upon a favorable comparison, enacting a second analog signal conditioning setting that includes a differing analog filtering,
wherein the comparing the indicia of remaining battery charge to a battery charge threshold is comprised of a progressive comparison to at least two different battery charge thresholds;
wherein the first analog signal conditioning setting and the second analog signal conditioning setting is comprised of at least two of, respective, different analog gain settings, analog filter settings, and ADC settings;
wherein upon an unfavorable progressive comparison, progressively enacting one at a time the at least two of, respective, different analog gain settings, analog filter settings, and ADC settings corresponding to the first analog signal conditioning setting; and upon a favorable comparison, progressively enacting one at a time the at least two of, respective, different analog gain settings, analog filter settings, and ADC settings corresponding to the second analog signal conditioning setting.

9. A method for managing power of a battery-powered handheld audio device comprises:
receiving, at the battery-powered handheld audio device, an indicia of remaining battery charge of a battery supply;
comparing the indicia of remaining battery charge to a battery charge threshold;
upon a favorable comparison, enabling a digital filtering operation; and
upon an unfavorable comparison, disabling the digital filtering operation;
wherein operating with the digital filtering operation enabled consumes more power than operating with the digital filtering operation disabled.

10. The method of claim 9 wherein the digital filtering operation comprises: weak-signal processing of a received continuous-time radio signal.

11. The method of claim 9 further comprising upon the favorable comparison enacting a first analog signal conditioning setting for conditioning a signal corresponding to a continuous time radio signal, the first analog signal conditioning setting including a first analog filter setting.

12. The method of claim 11 further comprising upon the unfavorable comparison enacting a second analog signal conditioning setting for conditioning the signal corresponding to the continuous time radio signal, the second analog signal conditioning setting including a second analog filter setting.

13. The method of claim 9 further comprising:
receiving, at the battery-powered handheld audio device, an indicia of signal quality for a received continuous-time radio signal;
comparing the indicia of signal quality to a signal quality threshold;
upon a favorable comparison of the indicia of signal quality to the signal quality threshold disabling the digital filtering operation by overriding the enabling resulting from the favorable battery charge comparison; and
upon an unfavorable comparison of the indicia of signal quality to the signal quality threshold, allowing the comparison of battery charge to control the digital filtering operation.

14. The method of claim 9 further comprising:
receiving, at the battery-powered handheld audio device, an indicia of signal quality for a received continuous-time radio signal;
comparing the indicia of signal quality to a signal quality threshold; and
upon an unfavorable comparison of the indicia of signal quality to the signal quality threshold, enabling the digital filtering operation by overriding the disabling resulting from the unfavorable comparison of battery charge.

15. A method for managing power of a battery-powered handheld audio device comprises:
receiving, at the battery-powered handheld audio device, an indicia of remaining battery charge of a battery supply;
comparing the indicia of remaining battery charge to a battery charge threshold;
upon a favorable comparison, enabling a digital filtering operation; and
upon an unfavorable comparison, disabling the digital filtering operation;
wherein the digital filtering operation includes a plurality of digital filtering levels and wherein with progressively more favorable comparisons of battery charge to the battery charge threshold, the enabling the digital filtering operation comprises sequential enabling of the digital filtering levels with sequentially increased battery consumption.

16. A method for managing power of a battery-powered handheld audio device comprises: receiving, at the battery-powered handheld audio device, an indicia of remaining battery charge of a battery supply; comparing the indicia of remaining battery charge to a battery charge threshold; upon a favorable comparison, enabling a digital filtering operation; and upon an unfavorable comparison, disabling the digital filtering operation; wherein upon a favorable comparison, a analog signal conditioning setting is enacted, the analog signal conditioning setting comprising a sequence of analog conditioning settings that are sequentially activated with increasingly more favorable comparisons of battery charge to the battery charge threshold.

17. A battery-powered handheld audio device comprises:
a radio signal decoder integrated circuit operably coupled to produce, from a received continuous-time radio signal, digital left-channel data, and digital right-channel data; and
a digital audio processing integrated circuit operably coupled to the radio signal decoder integrated circuit via a channel, wherein the digital audio processing integrated circuit produces audio signals for audio playback from at least one of the digital left- and right-channel data and a stored digital audio file,
wherein the digital audio processing integrated circuit includes:
a processing module, and
memory operably coupled to the processing module, wherein the memory stores operational instructions that cause the processing module to:
receive an indicia of remaining battery charge of a battery supply;
compare the indicia of remaining battery charge to a battery charge threshold;
upon a favorable comparison, enable a digital filtering operation; and
upon an unfavorable comparison, disable the digital filtering operation.

18. The battery-powered handheld audio device of claim 17 wherein the digital filtering operation comprises:
weak-signal processing of the received continuous-time radio signal.

19. The battery-powered handheld audio device of claim 17 wherein the memory stores operational instructions that further cause the processing module to:
receive an indicia of signal quality for a received continuous-time radio signal;
compare the indicia of signal quality to a signal quality threshold;
upon a favorable comparison of the indicia of signal quality to the signal quality threshold disabling the digital filtering operation by overriding the enabling resulting from the favorable battery charge comparison; and
upon an unfavorable comparison of the indicia of signal quality to the signal quality threshold, allowing the comparison of battery charge to control the digital filtering operation.

20. The battery-powered handheld audio device of claim 17 wherein the channel comprises
an Inter-IC ($I^2C$) bus.

* * * * *